United States Patent [19]

Hawkins

[11] Patent Number: 4,989,069

[45] Date of Patent: Jan. 29, 1991

[54] SEMICONDUCTOR PACKAGE HAVING LEADS THAT BREAK-AWAY FROM SUPPORTS

[75] Inventor: George W. Hawkins, Mesa, Ariz.

[73] Assignee: Motorola, Inc., Schaumburg, Ill.

[21] Appl. No.: 471,470

[22] Filed: Jan. 29, 1990

[51] Int. Cl.⁵ .................... H01L 23/48; H01L 23/54
[52] U.S. Cl. ........................................ 357/74; 357/70
[58] Field of Search ............... 357/72, 80, 74, 68, 357/67, 70; 174/52.4

[56] References Cited

U.S. PATENT DOCUMENTS

| | | | |
|---|---|---|---|
| 3,842,189 | 10/1974 | Southgate | 174/524 |
| 4,465,898 | 8/1984 | Orcutt et al. | 174/52.4 |
| 4,672,421 | 6/1987 | Lin | 357/74 |
| 4,724,280 | 2/1988 | Tsuji et al. | 357/74 |
| 4,794,446 | 12/1988 | Hamano | 357/74 |
| 4,872,047 | 10/1989 | Fister et al. | 357/74 |

Primary Examiner—Rolf Hille
Assistant Examiner—S. V. Clark
Attorney, Agent, or Firm—Harry A. Wolin

[57] ABSTRACT

A semiconductor package wherein a semiconductor die is disposed in packaging material and electrically coupled to leads having portions extending from the packaging material. The portions of the leads that extend from the packaging material are adhered to the outside of the packaging material and release therefrom when subjected to a predetermined amount thermal stress. The invention disclosed herein allows consistent alignment of flexible leads while adequately reducing stress caused by the differing coefficients of thermal expansion of the semiconductor package and a printed circuit or the like on which the package is mounted.

15 Claims, 2 Drawing Sheets

SEMICONDUCTOR PACKAGE HAVING LEADS THAT BREAK-AWAY FROM SUPPORTS

BACKGROUND OF THE INVENTION

This invention relates, in general, to semiconductor devices, and more particularly to a semiconductor package having leads that break-away from supports.

It is common in the semiconductor art to employ surface mount packages for placement on printed circuit boards and the like. Typically, the leads of a surface mount package are soldered directly to the printed circuit board so that electrical coupling occurs therebetween. An often arising problem is that the surface mount package and the printed circuit board on which it is mounted have different coefficients of thermal expansion. As a result, thermal contraction causes stress throughout the package and printed circuit board, especially at the leads and solder joints. The stress often causes the solder joints to break and the semiconductor package to function improperly.

One solution to reduce the problems caused by thermal contraction stress is to employ surface mount packages having thin metal leads that are flexible. The thin leads flex during thermal contraction and reduce damage to both the leads and solder joints. However, flexible leads on surface mount packages have a tendency to become misaligned. Lead misalignment results in open solder joints and has many deleterious effects in the mounting of surface mount packages. These problems are especially prevalent when very thin leads are required due to high lead counts and the like.

Accordingly, it would be highly desirable to have a semiconductor package that may be employed in surface mount applications that adequately counters the stress problems caused by the differing thermal expansion coefficients of the package and the printed circuit board on which the package is mounted while not having serious misalignment problems.

SUMMARY OF THE INVENTION

Accordingly, it is an object of the present invention to provide an improved semiconductor package that may be used in surface mount applications. A further object of the present invention is to provide an improved semiconductor package that reduces the effects of stress caused by differing coefficients of thermal expansion of the semiconductor package itself and that on which it is mounted.

It is an additional object of the present invention to provide an improved semiconductor package having reduced lead misalignment.

The foregoing and other objects and advantages are achieved in the present invention by one embodiment in which, as a part thereof, includes a semiconductor die having a stress buffer frame disposed thereabout. A lead tape, preferably comprising a polymer film with metal leads disposed thereon is adhered to at least one surface of the semiconductor die and the stress buffer frame. First portions of the metal leads are electrically coupled to the semiconductor die and second portions of the metal leads protrude from packaging material disposed about the semiconductor die, the stress buffer frame and the lead tape. The second portions of the metal leads are lightly adhered to the outside of the packaging material so that they will release therefrom when subjected to stress.

A more complete understanding of the present invention can be obtained by considering the following detailed description in conjunction with the accompanying drawings.

DETAILED DESCRIPTION OF THE INVENTION

Figure 1:
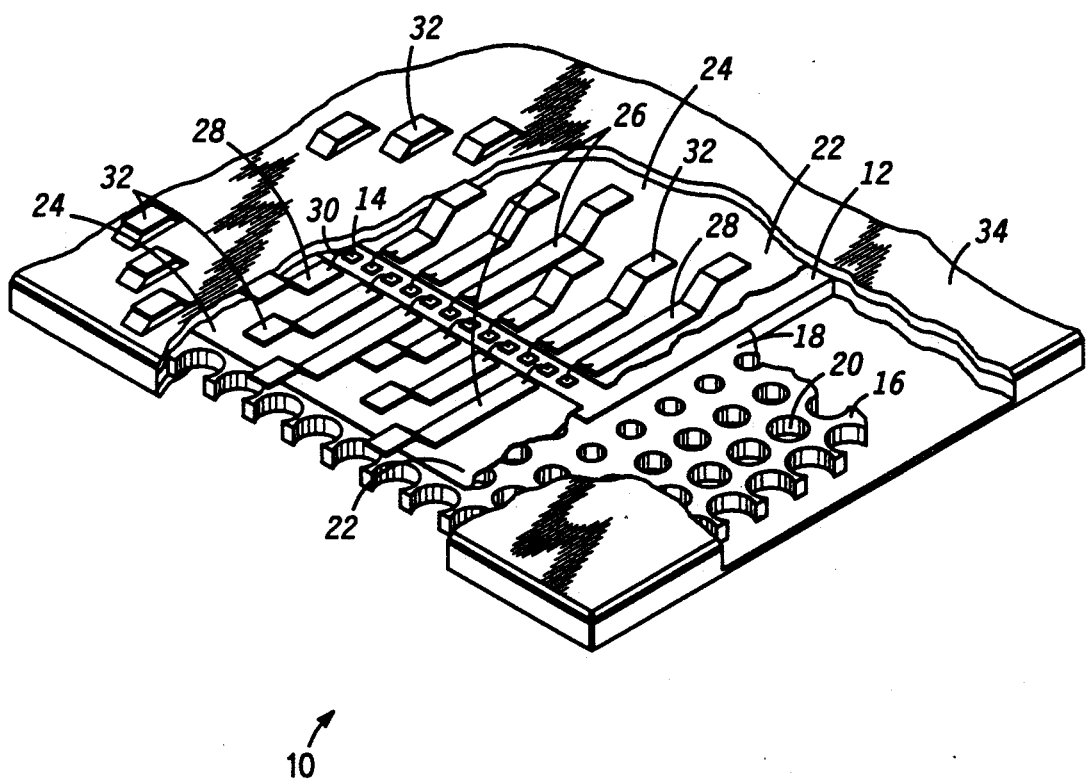
FIG. 1 is a highly enlarged plan view of a portion of a semiconductor package having parts thereof cut away.
Figure 2:
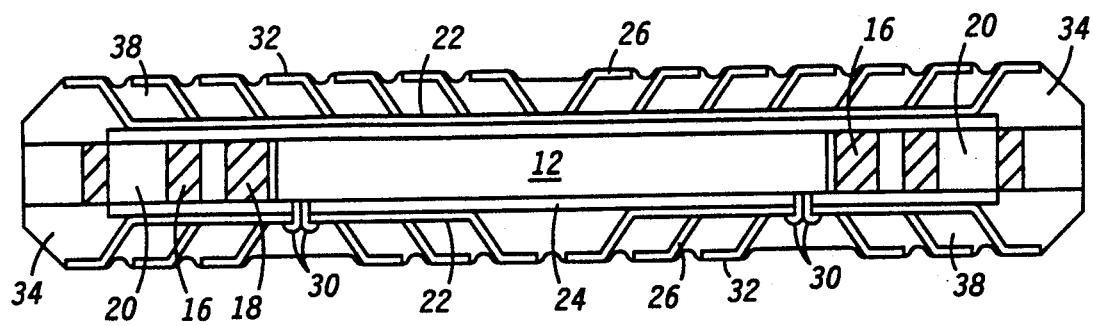
FIG. 2 is a highly enlarged cross-sectional view of a semiconductor package embodying the present invention.

FIG. 1 is a highly enlarged plan view of a portion of a semiconductor package 10 having parts thereof cut away while FIG. 2 is a highly enlarged cross-sectional view of semiconductor package 10. Semiconductor package 10 includes a semiconductor die 12. Semiconductor die 12 may be one of many types of semiconductor dice well known in the art. As shown in FIG. 1, semiconductor die 12 includes bond pads 14 through which external contact may be made to the inner metallization of semiconductor die 12.

A stress buffer frame 16 is disposed about semiconductor die 12. In this embodiment, stress buffer frame 16 has an inner edge 18 having approximately the same thickness as semiconductor die 12. Inner edge 18 of stress buffer frame 16 protects semiconductor die 12. Stress buffer frame 16 also includes holes 20 which make stress buffer frame 16 flexible and reduce the stress concentration in the packaging material. If a plastic packaging material is employed, holes 20 fill with plastic and mechanically lock the plastic to stress buffer frame 16 for better adhesion.

It is desirable that stress buffer frame 16 have approximately the same coefficient of thermal expansion as semiconductor die 12 so that their thermal contractions are essentially equal. For example, if semiconductor die 12 is comprised of silicon, stress buffer frame 16 might comprise a nickel/iron alloy such as Alloy 42. Alloy 42 serves especially well as stress buffer frame 16 in a plastic encapsulated package.

A lead tape 22 is adhered to the surfaces of semiconductor die 12 and stress buffer frame 16. Lead tape 22 includes adhesive film 24 comprised of polyimide in this embodiment although one of skill in the art will understand that film 24 may comprise other polymers and well known films. Metal leads 26 are disposed on film 24 which essentially serves to insulate leads 26 from portions of semiconductor die 12. Metal leads 26 are formed herein by depositing metal on film 24 and then etching the metal to form leads 26. Leads 26 include first portions 28 that are electrically coupled to semiconductor die 12. First portions 28 are electrically coupled to bond pads 14 of semiconductor die 12 by wire bonds 30. It should be understood that although lead tape 22 is disclosed herein, other lead tapes formed by different methods or other electrical coupling methods may be employed.

As shown, leads 26 of lead tape 22 are disposed both within the chip boundary and also outside of the chip boundary on stress buffer frame 16. By having leads 26 extend both inside and outside of the chip boundary, more leads 26 of a given size may be disposed in a unit area. This allows much more flexibility for bond pad and lead spacing.

It should further be understood that lead tape 22 may be disposed on one or both surfaces of semiconductor die 12 and stress buffer frame 16. For example, leads 26 disposed on a first surface of semiconductor die 12 may be employed as electrical connections thereto while leads 26 disposed on a second surface of semiconductor die 12 may be utilized as thermal connections to be bonded to a heat sink or the like.

Leads 26 include second portions 32 which are bent away from film 24 of lead tape 22 and semiconductor die 12. Second portions 32 of leads 26 allow semiconductor package 10 to be externally coupled. In a surface mount package or the like, second portions 32 of leads 26 are typically soldered to a printed circuit board, heat sink or similar article.

A plastic encapsulation 34 is disposed about semiconductor die 12, stress buffer frame 16 and lead tape 22 including film 24 and first portions 28 of leads 26. Although encapsulation 34 comprises epoxy plastic in this embodiment, it should be understood that many well known packaging materials such as polymers and ceramics may be employed.

Figure 3:
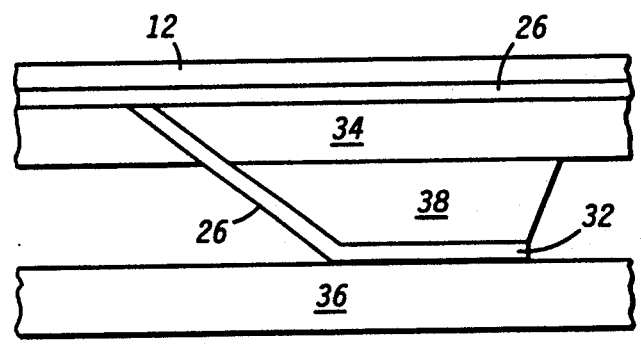
FIGS. 3-4 are highly enlarged cross-sectional views of a portion of a semiconductor package lead embodying the present invention.
Figure 4:
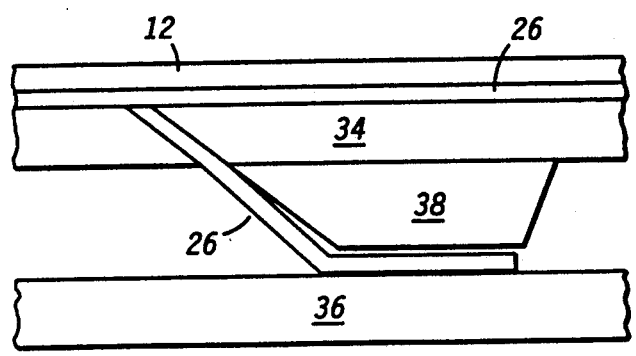

FIGS. 3-4 are highly enlarged cross-sectional views of a portion of a lead 26 of semiconductor package 10 embodying the present invention. Lead 26 extends from packaging material or encapsulation 34 so that it may be employed to make external contact. As shown, second portion 32 of lead 26 is soldered to a circuit board 36. Initially, second portion 32 of lead 26 is adhered to a protrusion 38 extending from encapsulation 34. Protrusion 38 comprises the same material as encapsulation 34 and is formed simultaneously with encapsulation 34 using a standard molding process. In a preferred embodiment, the adhesion of second portion 32 to protrusion 38 includes second portion 32 being partially embedded in protrusion 38.

By being adhered to protrusion 38, second portion 32 of lead 26 may be kept in relatively exact alignment so that semiconductor package 10 may be adequately solder bonded to circuit board 36. Following solder bonding of second portion 32 of lead 26 to circuit board 36, the stresses that act on semiconductor package 10 and circuit board 36 due to their differing coefficients of thermal expansion may cause lead 26 to break-away from protrusion 38, as illustrated in FIG. 4, thereby reducing the thermal stress effects on semiconductor package 10 including leads 26 as well as circuit board 36. It should be understood that the surface finish and composition of lead 26 and the adhesive characteristics of packaging material or encapsulation 34 and protrusions 38 must be compatible so that lead 26 will break away from protrusion 38 at a predetermined stress. It should further be understood that these surface finishes and compositions as well as the adhesive characteristics may be varied.

Thus it is apparent that there has been provided, in accordance with the invention, an improved semiconductor package having leads that break-away from supports which meets the objects and advantages set forth above. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A semiconductor package comprising:
   a semiconductor device;
   packaging material being disposed about said semiconductor device; and
   a plurality of leads having first portions electrically coupled to said semiconductor device, said plurality of leads further extending from said packaging material and at least some of said plurality of leads having second portions adhered to the outside of said packaging material so that they will release from said packaging material when subjected to a predetermined stress.

2. The package of claim 1 wherein the packaging material is a member of the group comprising polymers and ceramics.

3. The package of claim 1 wherein the semiconductor device is a semiconductor die and the plurality of leads are part of a lead tape being adhered to said semiconductor die.

4. The package of claim 1 wherein at least some of the plurality of leads have their second portions adhered to protrusions extending from and comprising the same material as the packaging material.

5. The package of claim 1 wherein the adhered second portions of at least some of the plurality of leads are partially embedded in the packaging material.

6. A semiconductor package comprising:
   a semiconductor die having a first surface and a second surface;
   a protective frame disposed around said semiconductor die;
   a lead tape including a plurality of leads having first portions electrically coupled to said semiconductor die, said lead tape being adhered to said semiconductor die and said protective frame; and
   packaging material disposed about said semiconductor die, said protective frame and said lead tape including said first portions, at least some of said plurality of leads of said lead tape having second portions adhered to the outside of said packaging material so that they will release from said packaging material when subjected to a predetermined stress.

7. The package of claim 6 wherein the protective frame has approximately the same thermal expansion coefficient as the semiconductor die.

8. The package of claim 6 wherein the lead tape is adhered to both the first and second surfaces of the semiconductor die.

9. The package of claim 6 wherein the packaging material is a member of the group comprising polymers and ceramics.

10. The package of claim 6 wherein at least some of the plurality of leads have their second portions adhered to protrusions extending from and comprising the same material as the packaging material.

11. The package of claim 6 wherein the adhered second portions of at least some of the plurality of leads are partially embedded in the packaging material.

12. A semiconductor comprising:
    a semiconductor die having a first surface and a second surface;
    a stress buffer frame disposed around said semiconductor die and having a substantially similar coefficient of thermal expansion;

a lead tape comprising a polymer with metal leads disposed thereon, said metal leads having first portions electrically coupled to said semiconductor die, said lead tape being adhered to said semiconductor die and said stress buffer frame so that said metal leads extend from said semiconductor die and from said stress buffer frame; and packaging material comprising one of a polymer or ceramic disposed about said semiconductor die, said stress buffer frame and said lead tape including said first portions, at least some of said metal leads having second portions adhered to the outside of said packaging material so that they will release from said packaging material when subjected to a predetermined stress.

13. The package of claim 12 wherein the lead tape is adhered to both the first and second surfaces of the semiconductor die.

14. The package of claim 12 wherein at least some of the metal leads have their second portions adhered to protrusions extending from and comprising the same material as the packaging material.

15. The package of claim 12 wherein the adhered second portions of at least some of the metal leads are partially embedded in the packaging material.

* * * * *